US012701791B2

(12) United States Patent
Kothari et al.

(10) Patent No.: US 12,701,791 B2
(45) Date of Patent: Aug. 4, 2026

(54) POWER SWITCH DESIGN

(71) Applicant: Apple Inc., Cupertino, CA (US)

(72) Inventors: Kapil K. Kothari, Fremont, CA (US); Abhimanyu Sharma, San Francisco, CA (US); Praveen Raghavan, Los Gatos, CA (US); Lama Mouayad, Milpitas, CA (US); Naveen Sai Jangala Naga, Milpitas, CA (US); Neeladri Sain, San Jose, CA (US); Vivekanandan Venugopal, Saratoga, CA (US); Ofir Elster, Raanana (IL)

(73) Assignee: Apple Inc., Cupertino, CA (US)

( * ) Notice: Subject to any disclaimer, the term of this patent is extended or adjusted under 35 U.S.C. 154(b) by 72 days.

(21) Appl. No.: 18/962,495

(22) Filed: Nov. 27, 2024

(65) Prior Publication Data

US 2026/0068325 A1 Mar. 5, 2026

Related U.S. Application Data

(60) Provisional application No. 63/689,339, filed on Aug. 30, 2024.

(51) Int. Cl.
*H10D 89/10* (2025.01)

(52) U.S. Cl.
CPC .................................. *H10D 89/10* (2025.01)

(58) Field of Classification Search
CPC .................................................... H10D 89/10
See application file for complete search history.

(56) References Cited

U.S. PATENT DOCUMENTS

| | | | |
|---|---|---|---|
| 7,598,630 B2 | 10/2009 | Burton | |
| 7,999,607 B2 | 8/2011 | Kuhn et al. | |
| 8,302,059 B2 * | 10/2012 | Pineda de Gyvez | . G06F 30/392 |
| | | | 716/135 |

(Continued)

FOREIGN PATENT DOCUMENTS

| | | |
|---|---|---|
| CN | 105335540 A | 2/2016 |
| CN | 116227412 A | 6/2023 |

(Continued)

OTHER PUBLICATIONS

International Search Report and Written Opinion in PCT Appl. No. PCT/US2025/044040 mailed Dec. 24, 2025, 10 pages.

*Primary Examiner* — Steven B Gauthier
*Assistant Examiner* — Khatib A Rahman
(74) *Attorney, Agent, or Firm* — Kowert, Hood, Munyon, Rankin & Goetzel, P.C.; Gareth M. Sampson; Dean M. Munyon

(57) ABSTRACT

Integrated circuit devices with power gated domains between functional circuit regions are described. The power gated domains include power switch cells that have active region logic (e.g., material type) that is continuous with the active region logic that is present in boundary cells adjacent the functional circuit regions. The power switch cell may be designed to provide sufficient power gating capability for components in the functional circuit regions while more efficiently utilizing space between the functional circuit regions. The efficient utilization of space may be useful for devices in which the functional circuit regions are regions with memory circuits and the power switch cell provides power gating for the memory circuits.

20 Claims, 9 Drawing Sheets

(56) References Cited

U.S. PATENT DOCUMENTS

| | | | | | |
|---|---|---|---|---|---|
| 8,726,216 B2 * | 5/2014 | Suzuki | ................. | G06F 30/392 |
| | | | | 716/122 |
| 8,987,786 B1 * | 3/2015 | Tan | ....................... | H03K 3/356 |
| | | | | 257/207 |
| 9,094,011 B2 * | 7/2015 | Koog | ................... | H03K 17/161 |
| 10,084,450 B1 * | 9/2018 | Cox | ....................... | G11C 5/147 |
| 10,396,778 B1 | 8/2019 | Narayan et al. | | |
| 11,862,620 B2 * | 1/2024 | Chang | ................... | H10D 89/10 |
| 2009/0079465 A1 | 3/2009 | Sasaki et al. | | |
| 2013/0328589 A1 * | 12/2013 | Ishii | ....................... | H10D 89/10 |
| | | | | 326/31 |
| 2016/0034630 A1 * | 2/2016 | Suzuki | ................. | G06F 30/392 |
| | | | | 716/122 |
| 2020/0082045 A1 * | 3/2020 | Lee | ....................... | G06F 30/398 |
| 2020/0328746 A1 * | 10/2020 | Park | ................... | H03K 19/0016 |
| 2022/0208757 A1 | 6/2022 | Do et al. | | |
| 2022/0271742 A1 | 8/2022 | Park et al. | | |

FOREIGN PATENT DOCUMENTS

| CN | 117435034 | A | 1/2024 |
|---|---|---|---|
| JP | 2008244066 | A | 10/2008 |
| JP | 4872264 | B2 | 2/2012 |

* cited by examiner

POWER SWITCH DESIGN

PRIORITY CLAIM

The present application claims priority to U.S. Provisional App. No. 63/689,339, entitled "Power Switch Design," filed Aug. 30, 2024, the disclosure of which is incorporated by reference herein in its entirety.

BACKGROUND

Technical Field

Embodiments described herein relate to power switches for semiconductor devices. More particularly, embodiments described herein relate to implementation of power switches in domains between functional circuit regions such as memory circuit regions.

Description of the Related Art

Large scale integrations of integrated circuits (such as very-large scale integrations (VLSIs)) may implement various techniques for saving power by reducing unnecessary power utilization that may cause power leakage. For instance, various VLSIs may implemented power gated domains between regions of functional circuits (such as memory circuits) where the power gated domain operates to turn off components within the functional circuit regions when the components are not in use (such as when the components are in standby or sleep modes). While various designs of power gated domains are currently implemented, having the power gated domain between the functional circuit regions may take up valuable silicon footprint. Additionally, any overdesign of the power gated domain (such as implementing much higher numbers of power switches than necessary for power gating in the functional circuit regions) may waste valuable space in the footprint of the device and create electrical inefficiency. Thus, there are both electrical and mechanical issues associated with many current implementations of power gated domains between functional circuit regions.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
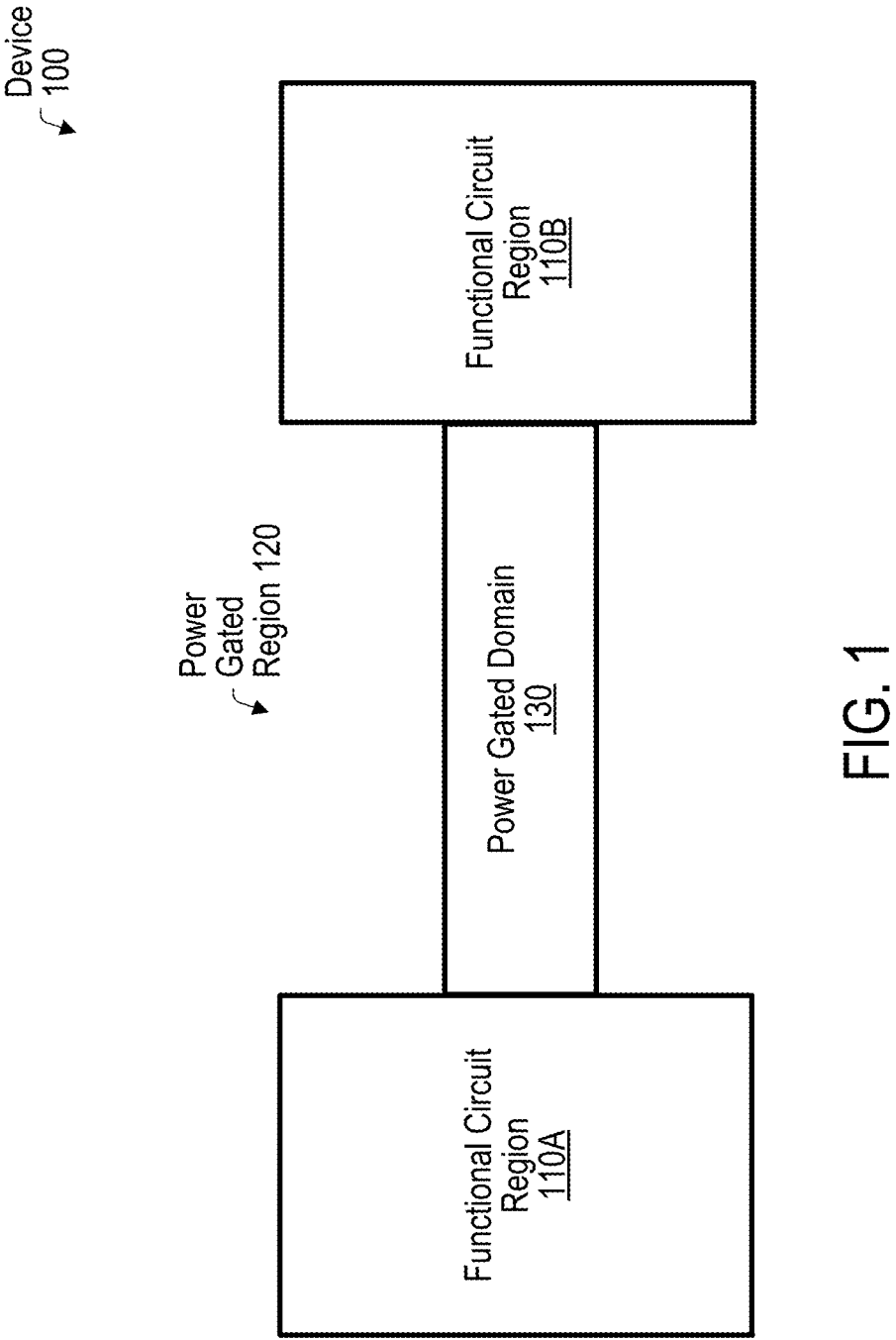
FIG. 1 depicts a top view representation of an integrated circuit device having a power gated region with a power gated domain between functional circuit regions, according to some embodiments.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

The present disclosure is directed to the implementation of power switches between regions of functional circuits (such as regions of memory circuits) in integrated circuit devices. In various embodiments, power switches between functional circuit regions are located in a power gated domain between the functional circuit regions. Power switches in the power gated domain may be used to control power to logic blocks within the functional circuit regions through power gating. Power gating is a process that uses the power switches to shut off power supply to various components (e.g., circuits) in the functional circuit regions when the components are in low power modes (e.g., sleep or standby mode). Shutting off these components when they are in low power modes may reduce power leakage in an integrated circuit device.

FIG. 1 depicts a top view representation of an integrated circuit device having a power gated region with a power gated domain between functional circuit regions, according to some embodiments. In the illustrated embodiment, device 100 includes two functional circuit regions-functional circuit region 110A and functional circuit region 110B with power gated region 120 between the functional circuit regions. In various contemplated embodiments, functional circuit regions 110A, 110B are memory circuit regions and power gated region 120 is a memory channel region between the memory circuit regions. In certain contemplated embodiments, functional circuit regions 110A, 110B are SRAM macros.

In various embodiments, power gated domain 130 is positioned in power gated region 120. Power gated domain 130 may be coupled to various components (e.g., circuits or cells) within functional circuit region 110A or functional circuit region 110B. Power gated domain 130 may include various power switches or circuits that enable a power gating process on the various components in functional circuit region 110A or functional circuit region 110B. For instance, power switches in power gated domain 130 may be turned off to power down logic (e.g., logic circuits or logic cells) in functional circuit region 110A or functional circuit region 110B, thereby reducing power leakage from the functional circuit regions.

Figure 2:
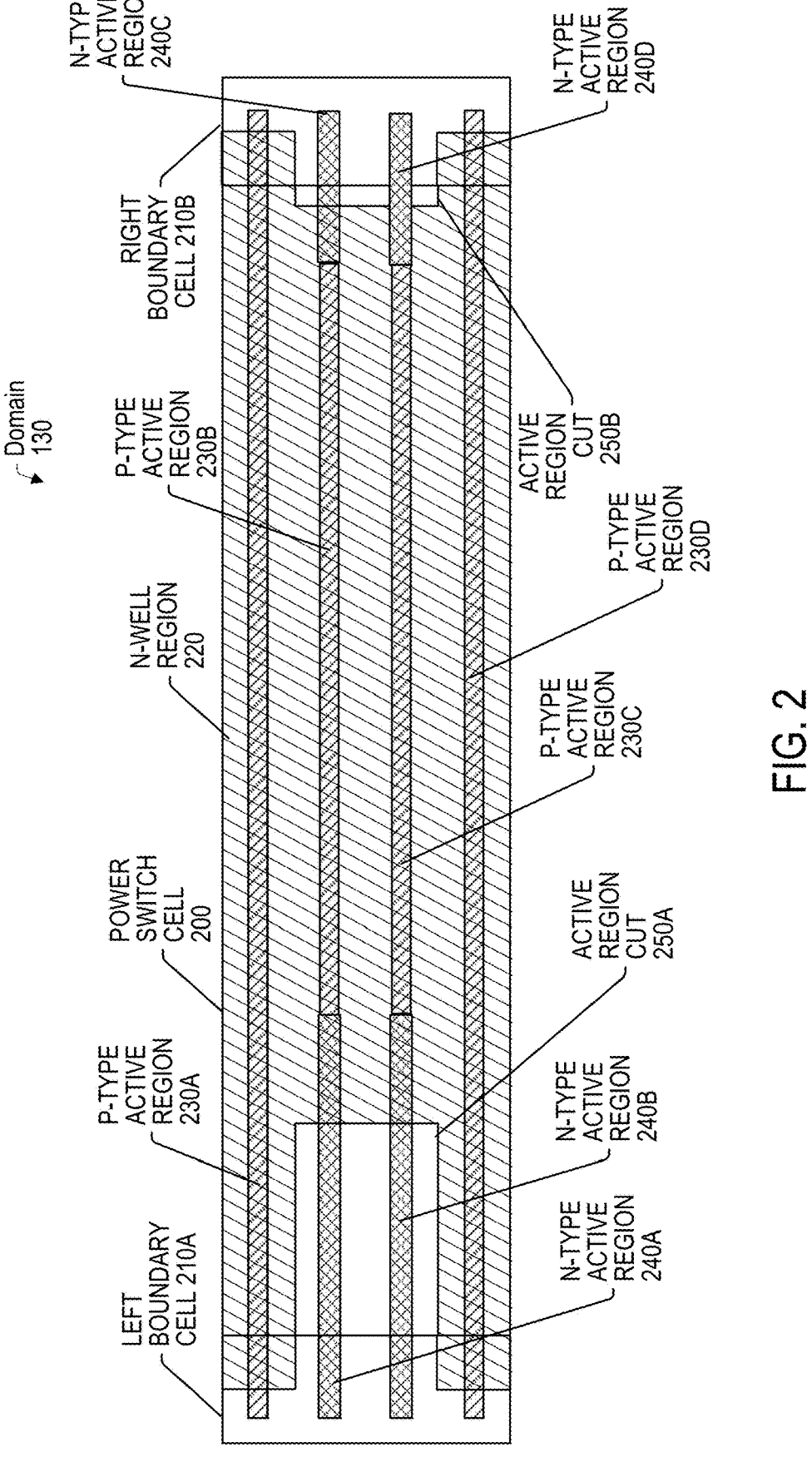
FIG. 2 depicts a top view cross-sectional representation of an example power gated domain, according to some embodiments.

FIG. 2 depicts a top view cross-sectional representation of an example power gated domain, according to some embodiments. In the illustrated embodiment, power gated domain 130 includes power switch cell 200 positioned between left boundary cell 210A and right boundary cell 210B. Power switch cell 200, left boundary cell 210A, and right boundary cell 210B may be formed on a semiconductor substrate (such as a p-type silicon substrate). With a p-type silicon substrate, n-type field effect transistors (NFETs or NMOS devices) are made by forming n-type active regions (e.g., n-type oxide diffusion regions) over the p-type substrate. Conversely, p-type field effect transistors (PFETs or PMOS devices) are made by forming n-well regions in the p-type substrate and forming p-type active regions (e.g., p-type oxide diffusion regions) over the n-well regions.

Typical cell epitaxy processes on p-type substrates result in the epitaxial pattern shown in left boundary cell 210A and right boundary cell 210B where two outer rows with p-type active regions above n-well regions are separated by two rows of n-type active regions above the p-type substrate without any n-well regions. For instance, in the illustrated embodiment, left boundary cell 210A has a first row (from the top of the figure) with p-type active region 230A above n-well region 220, a second row with n-type active region 240A above the p-type substrate, a third row with n-type active region 240B above the p-type substrate, and a fourth row with p-type active region 230D above n-well region 220. Note that the n-well regions below p-type active region 230A and p-type active region 230D would be separate n-well regions if not for the merging of the n-well region in power switch cell 200, as described below.

Power switches are most readily implemented as p-type field effect transistors (PFETs). Accordingly, in various embodiments, the number of switches available in power switch cell 200 is maximized by maximizing the area available for PFETs in the power switch cell. The area available for PFETs in power switch cell 200 may be increased from the basic epitaxial layout by cutting the n-type active regions within the power switch cell and replacing the cut portions with p-type active regions and merging the n-well across the power switch cell. For instance, as shown in FIG. 2, power switch cell 200 includes active region cut 250A that cuts n-type active region 240A and n-type active region 240B from left boundary cell 210A along with active region cut 250B that cuts n-type active region 240C and n-type active region 240D from right boundary cell 210B and allows p-type active region 230B and p-type active region 230C to be replace the n-type active region material inside the power switch cell. Additionally, n-well region 220 is merged inside power switch cell 200 and inside the areas defined by active region cut 250A and active region cut 250B.

The active region cuts and p-type active region replacement along with n-well merging inside power switch cell 200 increases (and maximizes) the number of PFETs that can be included in the power switch cell. The increase in the number of PFETs, however, does come at an area cost due to the cutting of the active regions, which increases the width of power switch cell 200. The increased width, as evidenced by FIG. 4, described further below, increases the footprint of the channel region between functional circuit regions and reduces flexibility in designing devices. Additionally, while increasing the number of PFETs in the power gated domain 130 is implemented, the number of PFETs now available may be beyond the numbers necessary for some power gated domain and functional circuit region designs. For instance, power switch cell 200 may be a maximized number of PFETs to generically cover many different designs of devices with functional circuit regions and power gated domains. There may be, however, many designs for which the maximized number of PFETs is overkill electrically for the power switching actually necessitated by the designs.

The present disclosure recognizes that there is room for improvement in designs of power switch cells in power gated domains that can more efficiently utilize space in the channel region (e.g., power gated region) between functional circuit regions while providing sufficient numbers of power switches to effect power gating in the functional circuit regions. The disclosed power switch cell may also, in some instances, improve the electrical efficiency within the power gated region between functional circuit regions.

Decreasing the footprint (e.g., space) utilized by a power gated domain may open up footprint outside the functional circuit regions. In some instances, the opened up footprint may be utilized to increase the number of other types of transistors or circuit elements, allowing for more complex or powerful devices. Accordingly, opening up the footprint may allow more flexibility in the design or manufacturing of integrated circuit devices with power gated domains. For instance, the design of integrated circuits may include more optimized routing strategies for signals in the devices with the opening up of the footprint and removal of blockages. Manufacturing may also be more efficient in certain instances with optimized design strategies for the power gated domains.

Certain embodiments disclosed herein have four broad elements: 1) a power switch cell between two boundary cells in a power gated region between functional circuit regions; 2) a continuous n-well region through the power switch cell and the two boundary cells, 3) continuous p-type active region over the n-well region and through the power switch cell and the two boundary cells, and 4) continuous n-type active region over the substrate outside the n-well region and through the power switch cell and the two boundary cells. In various embodiments, logic is implemented using the p-type active region over the n-well region in the power switch cell to form PFET power switches, which may be used in power gating operations. The continuous active regions are implemented without any breaks any the active regions (e.g., oxide diffusion is continuous through the power switch cell and between the two boundary cells). For instance, the active regions in the power switch cell are continuously formed with the active regions in both boundary cells. Thus, the power gated region cells may be formed with less processing steps and more efficiently than more complicated designs, such as shown in FIG. 2. While this may reduce the number of PFETs available within the power switch cell, the cell may still be designed with a sufficient number of PFETs for power gating of components in the functional circuit regions that border the power gated region. In some instances, the reduced number of PFETs in the power switch cell, in combination with the reduced channel region (e.g., power gated region) width, may improve electrical efficiency across the channel region.

Various illustrations of embodiments with these broad elements are now described in the present disclosure. It should be noted that the illustrated embodiments of the present disclosure depict design templates for devices with power switches in power switch cells positioned in power gated regions between functional circuit regions. These design templates provide basic building blocks from which many different types of power switching schemes for devices may be constructed based on the power switch cells in the design templates.

Figure 3:
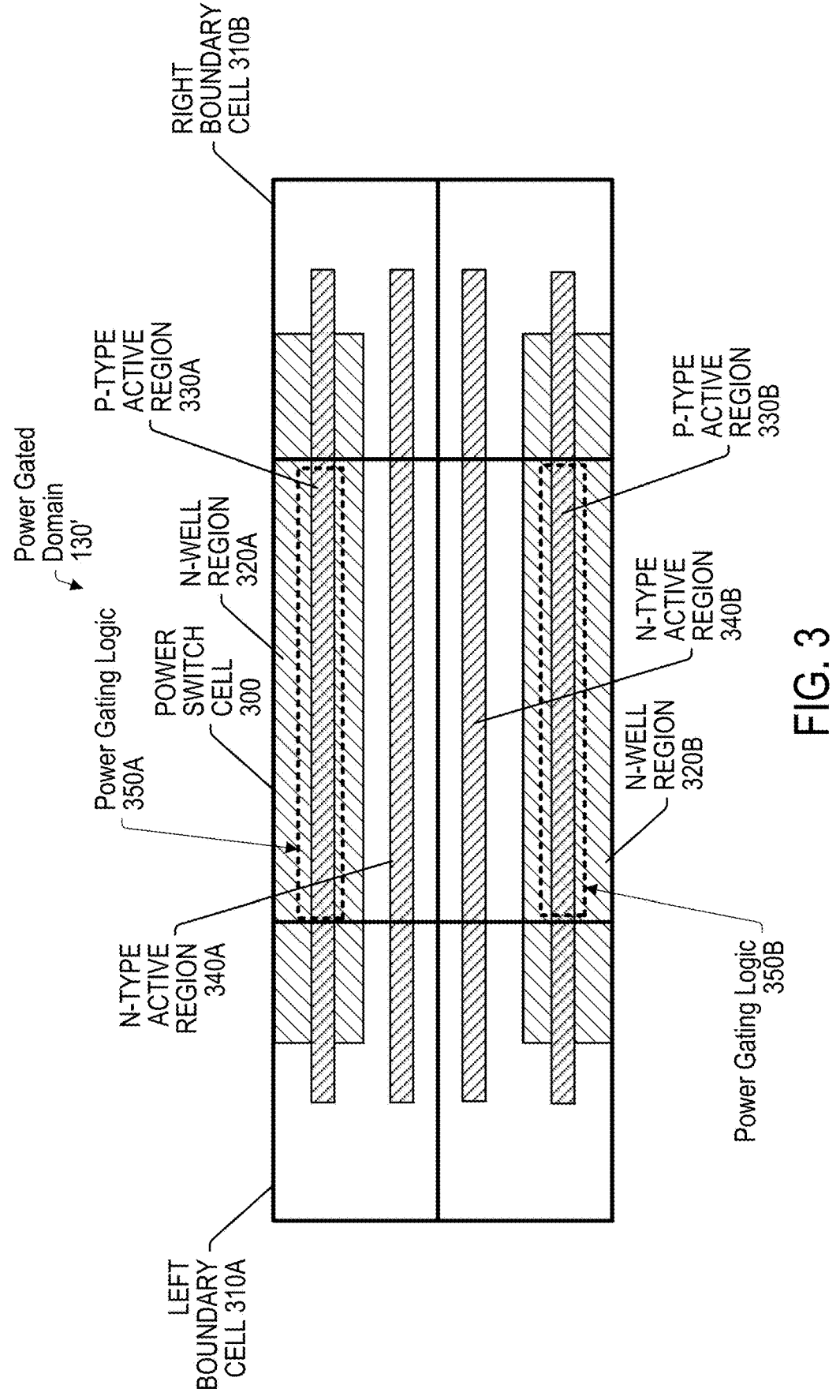
FIG. 3 depicts a top view cross-sectional representation of a power switch cell for a power gated domain, according to some embodiments.

FIG. 3 depicts a top view cross-sectional representation of a power switch cell for a power gated domain, according to some embodiments. In the illustrated embodiment, power gated domain 130' includes power switch cell 300 positioned between left boundary cell 310A and right boundary cell 310B. Power switch cell 300, left boundary cell 310A, and right boundary cell 310B may be formed on a semiconductor substrate (such as a p-type silicon substrate).

In various embodiments, n-well region 320A and n-well region 320B are formed in the p-type substrate. In certain embodiments, n-well region 320A and n-well region 320B are n-well regions that are continuous from left boundary cell 310A, through power switch cell 300, and into right boundary cell 310B. For instance, n-well region 320A and n-well region 320B may be formed as single n-well regions that span across the cells. In some embodiments, n-well region 320A and n-well region 320B are formed in a single n-well forming process on the substrate (note that n-well region 320A and n-well region 320B may be formed separately in different, single n-well forming processes in some variations). Note that isolation may be formed in n-well region 320A or n-well region 320B when logic (e.g., power switches or power gating logic) is formed in power switch cell 300. Even with the isolation, n-well region 320A or n-well region 320B may be considered to be "continuous" through power switch cell 300 between left boundary cell 310A and right boundary cell 310B.

In various embodiments, p-type active regions are formed over the n-well regions and n-type active regions are formed over portions of the substrate without n-well regions (e.g., directly above p-substrate material). For instance, as shown in FIG. 3, p-type active region 330A is formed over n-well region 320A and p-type active region 330B is formed over n-well region 320B while n-type active region 340A and n-type active region 340B are formed directly over portions of the substrate outside the n-well regions.

In the illustrated embodiment of FIG. 3, both the p-type active regions (e.g., p-type active region 330A and p-type active region 330B) and the n-type active regions (e.g., n-type active region 340A and n-type active region 340B) may be considered to be "contiguous" within power switch cell 300 as the active region materials (e.g., oxide diffusion materials) are continuously the same type of material in the power switch cell without any cuts or breaks in the active regions that changes the material from p-type active region material to n-type active region material (as shown in the embodiment of FIG. 2) or vice versa. Accordingly, p-type active region 330A and p-type active region 330B along with n-type active region 340A and n-type active region 340B are "continuous" from left boundary cell 310A, through power switch cell 300, and into right boundary cell 310B in that the active regions have the continuity of either p-type active region material or n-type active region material across the cells in power gated domain 130'. Additionally, the n-well regions underlying the p-type active regions-n-well region 320A and n-well region 320B-remain "continuous" as defined and described above.

Within the above-described definition of "continuous" active region material (or continuity in the active region material), various embodiments for deposition of the active region material may be contemplated. For instance, in some embodiments, the active regions include active region material (e.g., gate material, source/drain material, etc.) that is placed as a continuous material from left boundary cell 310A, through power switch cell 300, and into right boundary cell 310B. Further processing may, however, create breaks or separations in the active region material such as when implementing logic (e.g., power switches or power gating logic) in the active regions. For example, source/drain regions may be formed as continuous regions with isolation subsequently placed in the source/drain regions to define transistor areas for power switches in power switch cell 300. Similar processing may occur for gate material in the active regions. It is important to note that these breaks or separations are not epitaxial cuts that change the type of active region material being placed. Embodiments may also be contemplated where the active region material is placed as separate materials during one or more process steps over the n-well regions or p-substrate inside power switch cell 300.

Figures 4, 5:
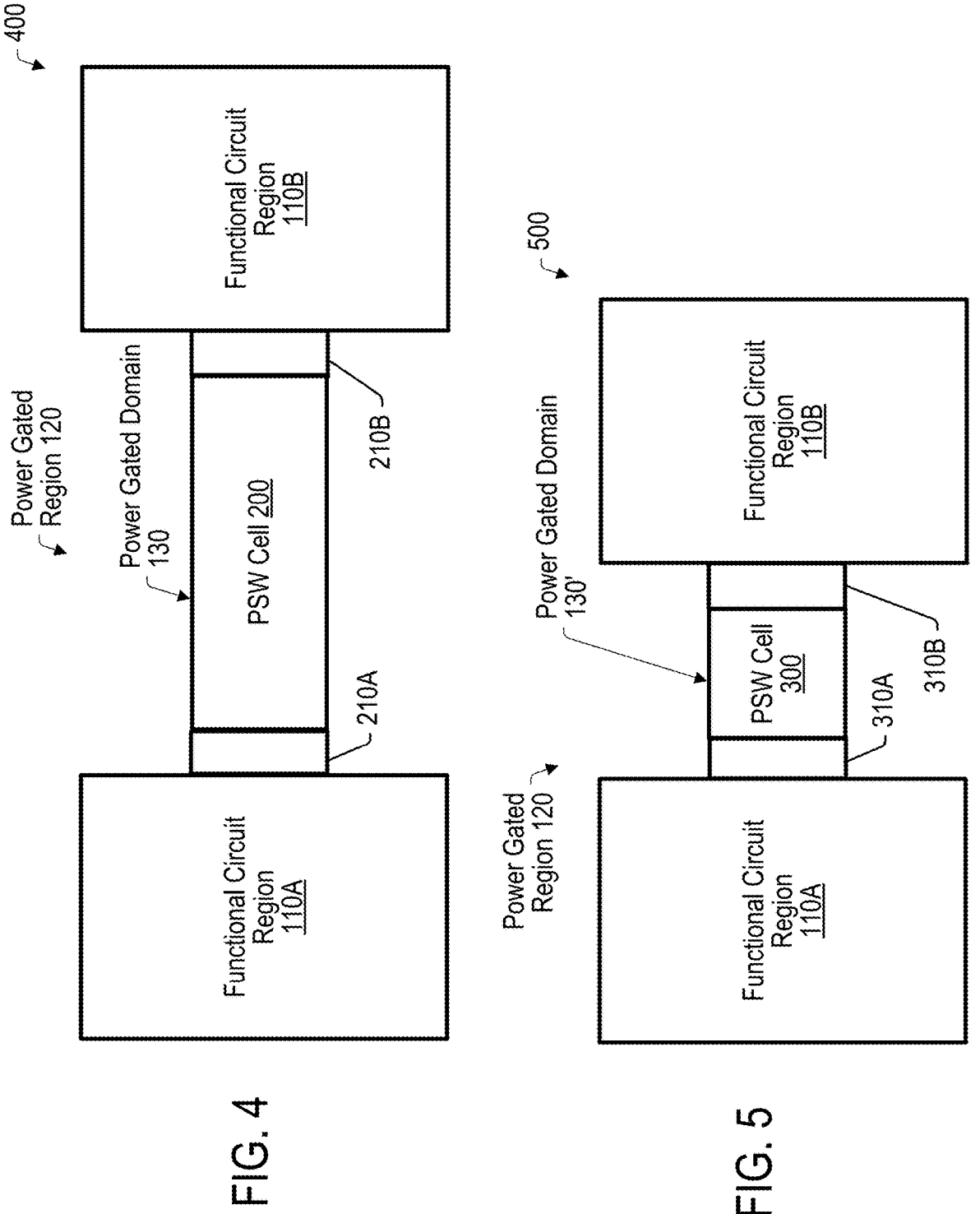
FIG. 4 depicts a top view representation of an integrated circuit device that includes a power gated domain in a power gated region between functional circuit regions, according to some embodiments.
FIG. 5 depicts a top view representation of an integrated circuit device that includes another power gated domain in a power gated region between functional circuit regions, according to some embodiments.

In certain embodiments, one or more power switches may be made as PFETs (e.g., PMOS transistors) inside power switch cell 300 in the areas where p-type active regions are formed over n-well regions (e.g., where p-type active region 330A is over n-well region 320A or where p-type active region 330B is over n-well region 320B). The various power switches may form power gating logic 350A (dashed line) in the area where p-type active region 330A is over n-well region 320A or power gating logic 350B (dashed line) in the area where p-type active region 330B is over n-well region 320B. Power gating logic 350A or power gating logic 350B may be coupled to logic in functional circuit regions adjacent left boundary cell 310A or right boundary cell 310B (such as functional circuit region 110A or functional circuit region 110B, as shown in FIG. 5). In various embodiments, left boundary cell 310A or right boundary cell 310B include logic that couples the power switches in power switch cell 300 to components in the functional circuit regions. Accordingly, power gating logic 350A or power gating logic 350B include logic that provides power gating operation to components in the functional circuit regions adjacent left boundary cell 310A or right boundary cell 310B.

While power gating is provided by PFETS where p-type active regions are formed over n-well regions, NFETs (or NMOS transistors) are not typically useful for power switching or power gating. Accordingly, in various embodiments, the areas where n-type active regions are formed over p-substrate (e.g., areas where n-type active region 340A or n-type active region 340B are over the substrate outside n-well region 320A and n-well region 320B) may have no functionality within power switch cell 300. In certain embodiments, n-type active region 340A or n-type active region 340B may be electrically isolated (e.g., electrically floated) or electrically tied off (e.g., has a locked in logic state) to inhibit any interaction with active components (e.g., power gating logic 350A or power gating logic 350B) in power switch cell 300.

As described herein, having the continuous n-well region and active region logic of power switch cell 300 provides spatial advantages over current power switch cells (such as power switch cell 200) that have cuts in active regions and change the type of active region material within the power switch cell. FIGS. 4 and 5 depict an example of the increase efficiency of spatial utilization achieved by implementing power switch cell 300 versus power switch cell 200. FIG. 4 depicts a top view representation of integrated circuit device 400 that includes power gated domain 130 (with power switch cell 200, left boundary cell 210A, and right boundary cell 210B from FIG. 2) in power gated region 120 between functional circuit regions 110A, 110B, according to some embodiments. FIG. 5 depicts a top view representation of integrated circuit device 500 that includes power gated domain 130' (with power switch cell 300, left boundary cell 310A, and right boundary cell 310B from FIG. 3) in power gated region 120 between functional circuit regions 110A, 110B, according to some embodiments.

As is clearly shown by a comparison of FIG. 4 to FIG. 5, the utilization of power switch cell 300 (and corresponding left boundary cell 310A and right boundary cell 310B) in power gated domain 130' provides a more efficient utilization of space inside the integrated circuit device. For instance, the reduced width of power switch cell 300 allows functional circuit region 110B to be positioned closer to functional circuit region 110A and adds additional space in integrated circuit device 500 that may be utilized for other functions (such as additional functional circuit regions or power gated domains). The extra space provided by the utilization of power switch cell 300 further gives design flexibility for device 500 for other processes such as tape outs.

Additionally, as described above, power switch cell 300 may be designed to provide sufficient power gating capability for the components in functional circuit region 110A or functional circuit region 110B. Accordingly, power gating performance may be maximized within a smaller footprint through utilization of power switch cell 300. Further, the shorter channel length needed to accommodate power switch cell 300 provides more efficient utilization in both space and electrical power utilization.

Example Manufacturing Methods

Figure 6:
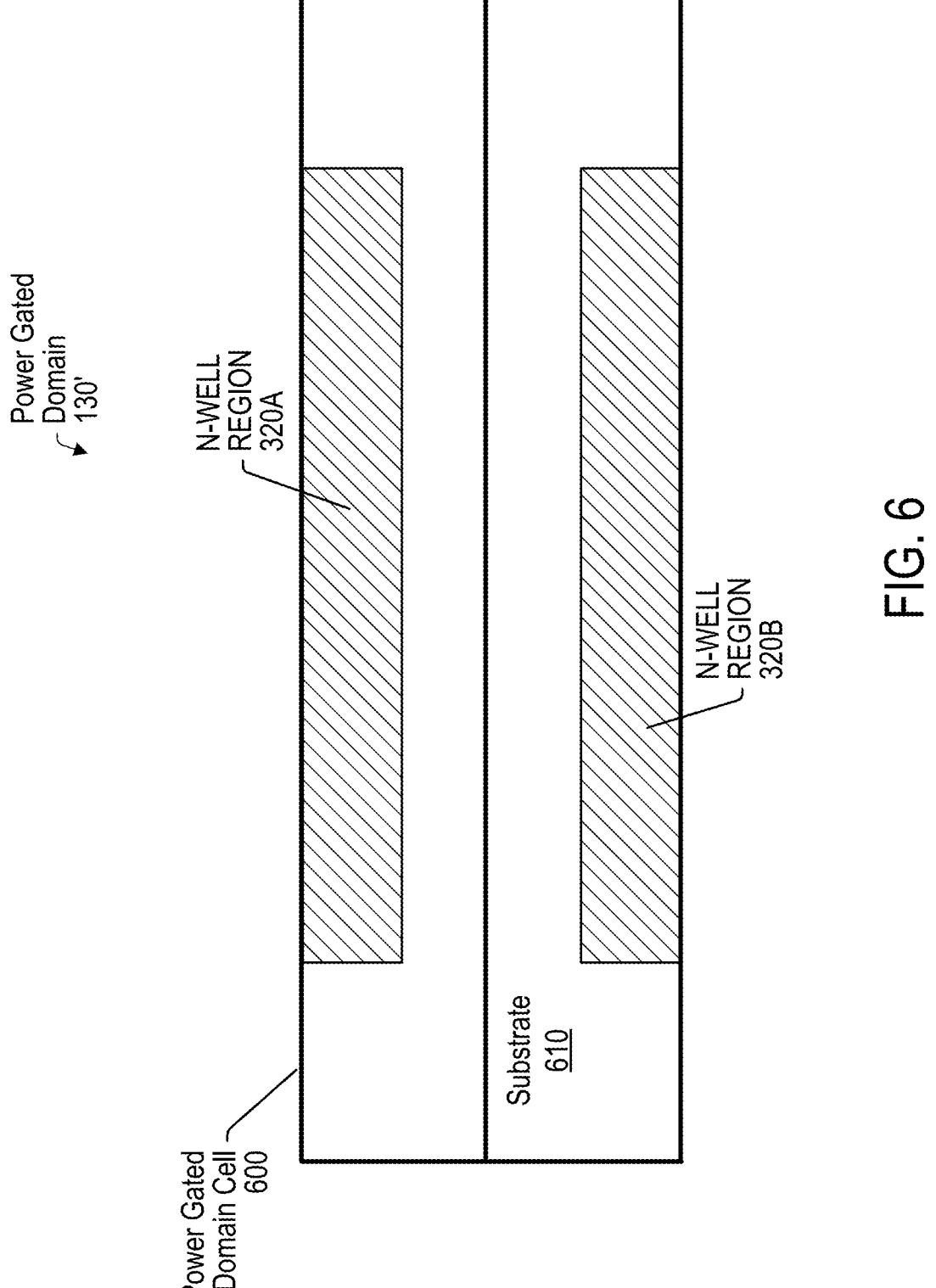
FIG. 6 is a top view cross-sectional representation of a process step that forms n-well regions for a power switch cell in a power gated domain, according to some embodiments.
Figure 7:
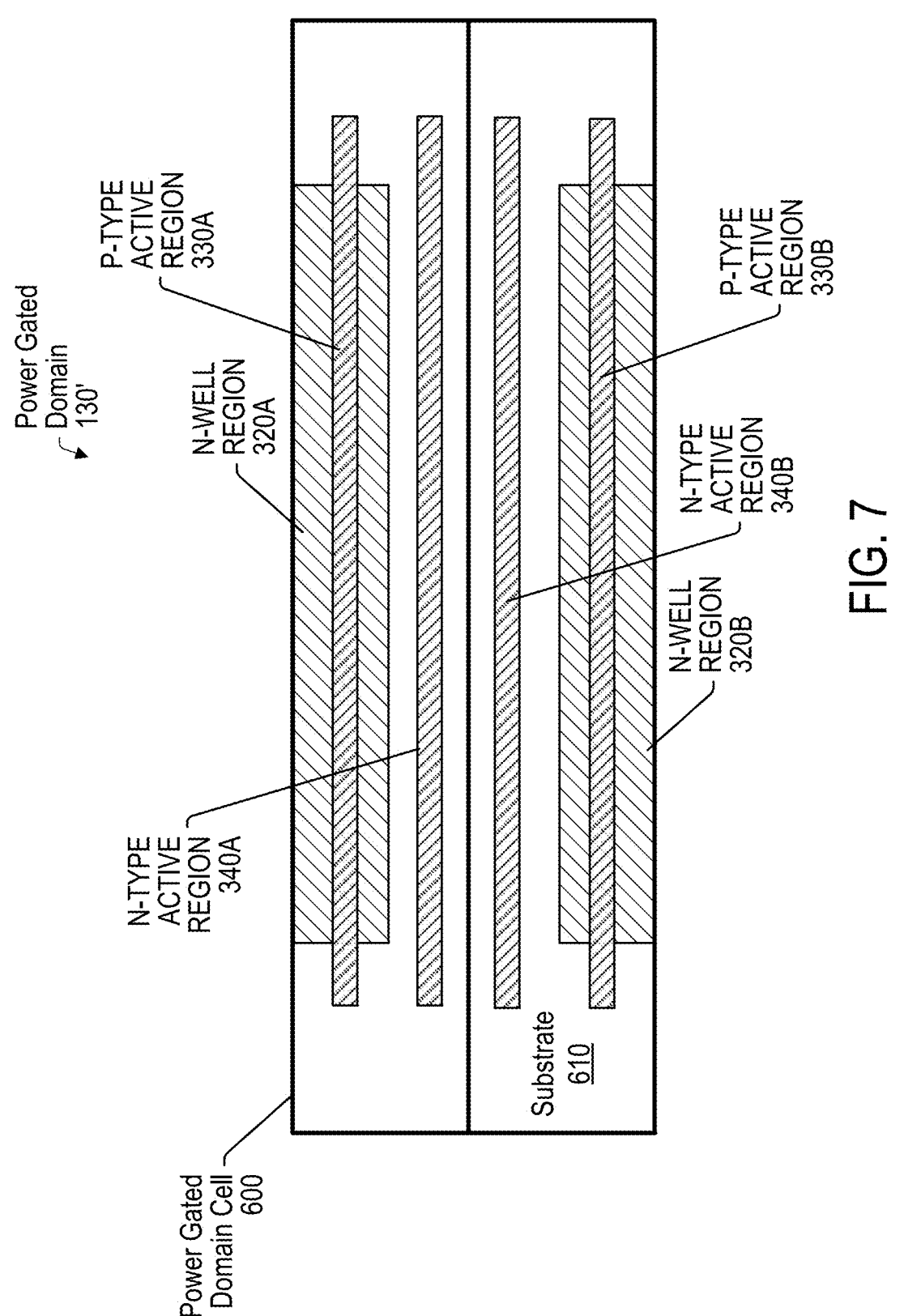
FIG. 7 is a top view cross-sectional representation of a process step that forms active regions for a power switch cell in a power gated domain, according to some embodiments.
Figure 8:
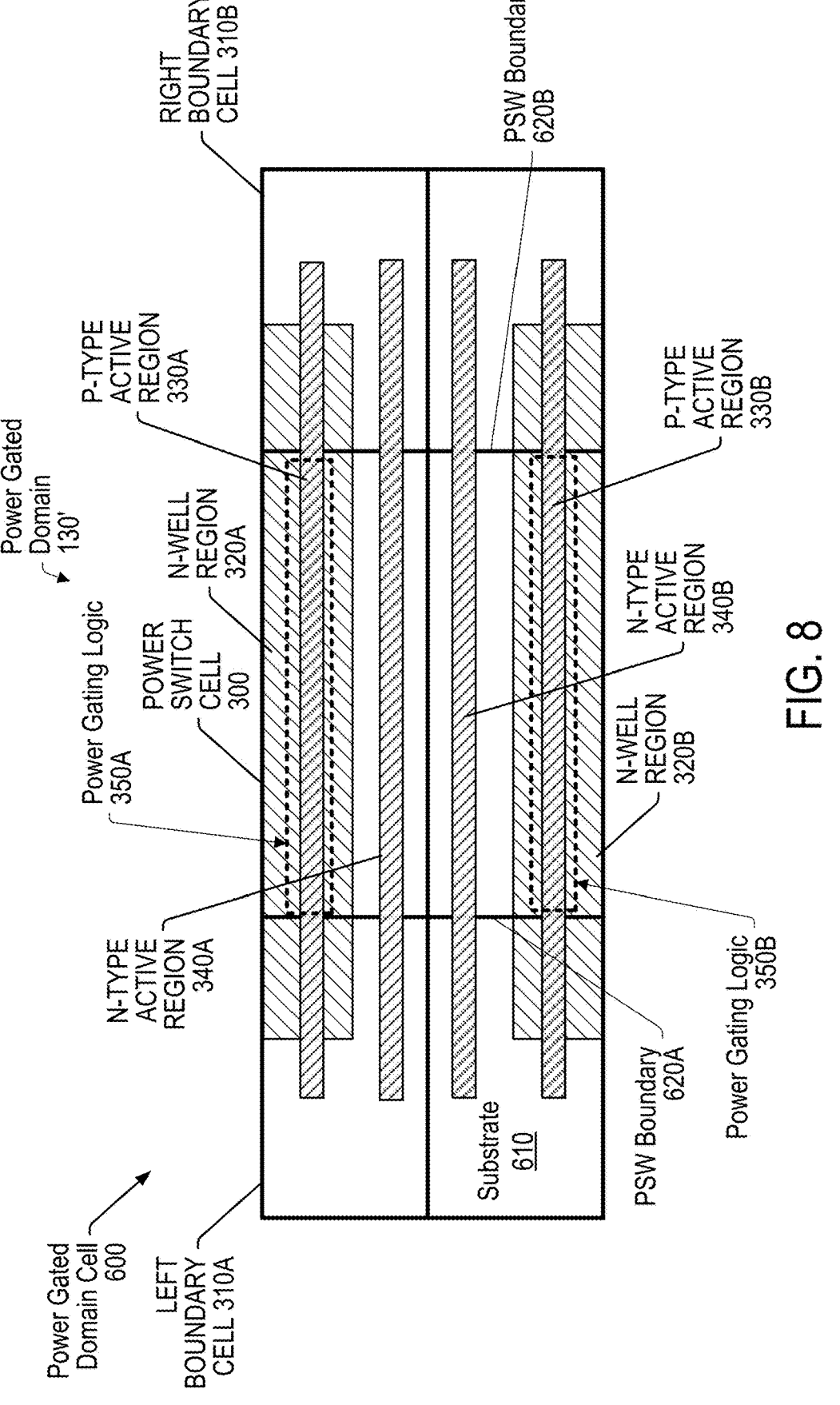
FIG. 8 is a top view cross-sectional representation of a process step that forms power gating logic for a power switch cell in a power gated domain, according to some embodiments.

FIGS. 6-8 depict top view cross-sectional representations of various possible steps in an exemplary embodiment of a method for manufacturing (e.g., building up) the power gated domain structures with the power switch cell shown in FIG. 3. Note that FIGS. 6-8 are shown along the top view cross-sectional representation similar to FIG. 3 for showing results of manufacturing (e.g., process or build-up) steps to form various embodiments of the power gated domain structures including the power switch cell. For instance, the cross-sectional representations in FIGS. 6-8 illustrate possible structural results of build-up steps for the power switch cell and the boundary cells. It is noted that FIGS. 6-8 depict cross-sectional representations of intermediate structural results (e.g., structural end results for well regions and active regions in a layer-by-layer manufacturing or build-up process) of steps involved in forming the full power gated domain structures described herein. Furthermore, it is noted that FIGS. 6-8 and the accompanying description may not provide some details to specific structures (or their manufacturing steps) within well regions, active regions, or logic regions but those skilled in the art would understand the structures and related manufacturing steps necessary to implement the well regions, active regions, or logic regions based on the description herein.

In various embodiments, one or more semiconductor manufacturing processing steps are implemented to form the intermediate structural results or structural end results depicted in FIGS. 6-8. Examples of semiconductor manufacturing processing steps include, but are not limited to, wafer fabrication, etching (e.g., material removal), photolithography processing, deposition (e.g., material deposition), planarization (e.g., chemical mechanical planarization), ion implantation (e.g., doping), packaging, and packaging test (e.g., end product testing). Etching may include any of various etching techniques such as, but not limited to, wet etching, dry etching, plasma etching, and laser etching. Photolithography processing may include steps for mask deposition, irradiation (e.g., patterning), pattern transfer (including any related etching, deposition, or ion implantation steps), and mask removal (if necessary). Material deposition may include deposition processes such as, but not limited to, physical deposition, chemical deposition, chemical vapor deposition, evaporation, diffusion, spin coating, and electron beam deposition.

Any of the various semiconductor manufacturing processing steps mentioned above along with any related semiconductor manufacturing processing steps not explicitly disclosed may be implemented to arrive at the structures depicted in FIGS. 6-8 with the understanding that those skilled in the art would be able to determine a set of appropriate semiconductor manufacturing processing steps for implementing the depicted structures based on the present disclosure. Additionally, at some points throughout the present disclosure, semiconductor manufacturing processing steps may be explicitly recited in relation to specific structures. In such instances, it is understood that variations beyond the explicitly recited semiconductor manufacturing processing steps may be possible as known to those skilled in the art. Thus, while FIGS. 6-8 depict one exemplary embodiment for step-by-step manufacturing of devices described herein, additional embodiments for manufacturing devices described herein may be contemplated with modifications or alternatives that fall within the spirit or scope of the present disclosure where such modification or alternatives may include variations on the disclosed semiconductor manufacturing processing steps.

FIG. 6 is a top view cross-sectional representation of a process step that forms n-well regions for a power switch cell in power gated domain 130', according to some embodiments. In the illustrated embodiment, power gated domain cell is formed on substrate 610. In various embodiments, substrate 610 is a semiconductor substrate such as a silicon substrate. In certain embodiments, n-well region 320A and n-well region 320B are formed in substrate 320B. N-well region 320A and n-well region 320B may be formed, for example, through a doping process applied to exposed areas of substrate 610. Examples of doping processes include, but are not limited to, implantation or diffusion processes. A silicon dioxide or other insulating material mask may be applied to substrate 610 to define the regions that are exposed to the dopants in order to form n-well region 320A and n-well region 320B.

In various embodiments, active regions are formed after the formation of n-well region 320A and n-well region 320B. FIG. 7 is a top view cross-sectional representation of a process step that forms active regions for a power switch cell in power gated domain 130', according to some embodiments. In the illustrated embodiment, p-type active region 330A and p-type active region 330B are formed over n-well region 320A and n-well region 320B, respectively, while n-type active region 340A and n-type active region 340B are formed over portions of substrate 610 outside the n-well regions. In certain embodiments, active regions 330 and active regions 340 are oxide diffusion regions, as described herein. In various embodiments, the source, drain, and channel regions for transistors of the power gated domain are formed in active (e.g., oxide diffusion) regions 330/340. In some embodiments, other regions such as bulk regions may be formed in active regions 330/340.

In some embodiments, active regions 330 and active regions 340 may be formed by placing a gate oxide on the surface of the substrate followed by a gate material (e.g., either p-type gate material or n-type gate material accordingly) that defines where gates are to be located on substrate 610 (either in areas above n-well regions 320 or areas not above the n-well regions). Ion implantation doping may then be performed using the gate material (and/or other structures) as a mask. The portions outside the mask are exposed to the ion implantation and form source and diffuse regions with channel regions between the source and diffusion regions then being defined under the gate material. Typically, one of the types of active regions is formed first followed by the other type of active region. Depending on the manufacturing process either active regions 330 (e.g., the p-type active regions) or active regions 340 (e.g., the n-type active regions) may be formed first.

Figure 9:
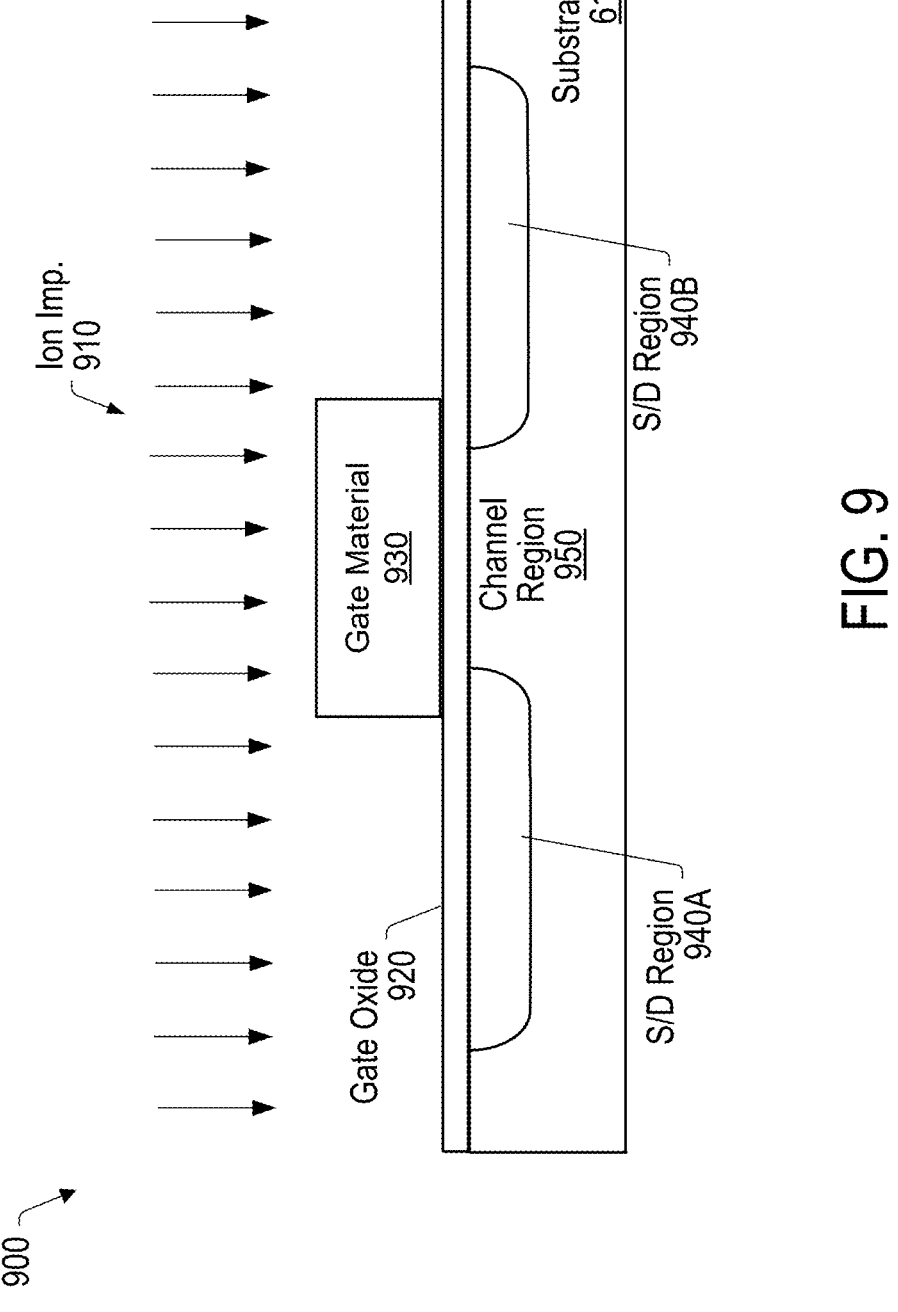
FIG. 9 is a cross-sectional side-view representations of an example ion implantation process, according to some embodiments.

FIG. 9 is a cross-sectional side-view representations of an example ion implantation process, according to some embodiments. In the illustrated embodiment, process 900 includes ion implantation 910 exposure of the device. In some embodiments, ion implantation 910 may include exposure to various p-type dopant ions (such as boron) or n-type dopant ions (such as phosphorous or arsenic) depending on the type of doping desired.

In certain embodiments, as shown in FIG. 9, ion implantation 910 is applied to substrate 610 with gate oxide 920 and gate material 930 formed on the surface of the substrate. Ion implantation 910 then forms source/drain (e.g., doping) region 940A on one side of gate material 930 and source/drain (e.g., doping) region 940B on the other side of the gate material. Channel region 950 is formed between source/drain region 940A and source/drain region 940B.

Turning back to FIG. 7, in certain embodiments, p-type active region 330A is continuous over and extends beyond the left/right horizontal boundaries of n-well region 320A. Similarly, p-type active region 330B is continuous over and extends beyond the left/right horizontal boundaries of n-well region 320B. N-type active region 340A may have a similar length and extension to p-type active region 330A while n-type active region 340B has a similar length and extension to p-type active region 330B. Accordingly, p-type active region 330A and n-type active region 340A are aligned and p-type active region 330B and n-type active region 340B are aligned. In some embodiments, all four active regions may be in alignment, as is depicted in FIG. 7, thought embodiments may be contemplated where the active regions are not necessarily in alignment.

FIG. 8 is a top view cross-sectional representation of a process step that forms power gating logic for a power switch cell in power gated domain 130', according to some embodiments. After active regions 330 and active regions 340 are formed, power gating logic 350 may be formed on p-type active regions 330. Power gating logic 350 may include, for example, gate connection structures, source/drain region connection structures, and other logic associated with power switch circuits for operation of power gate domain 130'.

In various embodiments, the boundaries of power gating logic 350 define power switch cell 300 and the boundary cells—left boundary cell 310A and right boundary cell 310B. For instance, in the illustrated embodiment, power gating logic 350A is formed on p-type active region 330A and power gating logic 350B is formed on p-type active region 340A. Power switch boundary 620A is a boundary at the left side of power gating logic 350A and power gating logic 350B that separates power switch cell 300 from left boundary cell 310A. Correspondingly, power switch boundary 620B is a boundary at the right side of power gating logic

350A and power gating logic 350B that separates power switch cell 300 from right boundary cell 310B.

Example Computer System

Figure 10:
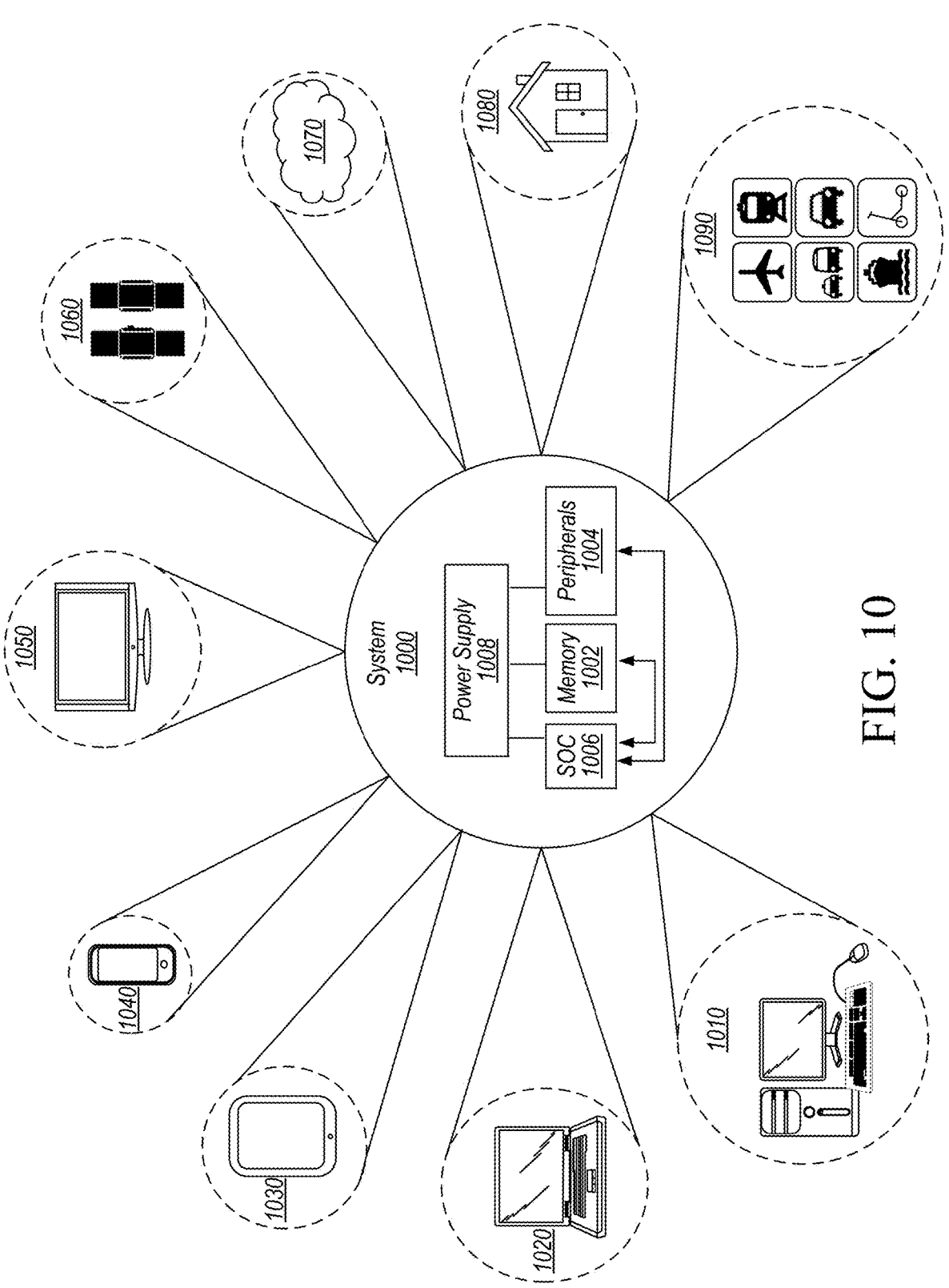
FIG. 10 is a block diagram of one embodiment of an example system.

Turning next to FIG. 10, a block diagram of one embodiment of a system 1000 is shown that may incorporate and/or otherwise utilize the methods and mechanisms described herein. In the illustrated embodiment, the system 1000 includes at least one instance of a system on chip (SoC) 1006 which may include multiple types of processing units, such as a central processing unit (CPU), a graphics processing unit (GPU), or otherwise, a communication fabric, and interfaces to memories and input/output devices. In some embodiments, one or more processors in SoC 1006 includes multiple execution lanes and an instruction issue queue. In various embodiments, SoC 1006 is coupled to external memory 1002, peripherals 1004, and power supply 1008.

A power supply 1008 is also provided which supplies the supply voltages to SoC 1006 as well as one or more supply voltages to the memory 1002 and/or the peripherals 1004. In various embodiments, power supply 1008 represents a battery (e.g., a rechargeable battery in a smart phone, laptop or tablet computer, or other device). In some embodiments, more than one instance of SoC 1006 is included (and more than one external memory 1002 is included as well).

The memory 1002 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1004 include any desired circuitry, depending on the type of system 1000. For example, in one embodiment, peripherals 1004 includes devices for various types of wireless communication, such as Wi-Fi, Bluetooth, cellular, global positioning system, etc. In some embodiments, the peripherals 1004 also include additional storage, including RAM storage, solid state storage, or disk storage. The peripherals 1004 include user interface devices such as a display screen, including touch display screens or multi-touch display screens, keyboard or other input devices, microphones, speakers, etc.

As illustrated, system 1000 is shown to have application in a wide range of areas. For example, system 1000 may be utilized as part of the chips, circuitry, components, etc., of a desktop computer 1010, laptop computer 1020, tablet computer 1030, cellular or mobile phone 1040, or television 1050 (or set-top box coupled to a television). Also illustrated is a smartwatch and health monitoring device 1060. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1000 may further be used as part of a cloud-based service(s) 1070. For example, the previously mentioned devices, and/or other devices, may access computing resources in the cloud (i.e., remotely located hardware and/or software resources). Still further, system 1000 may be utilized in one or more devices of a home 1080 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 10 is the application of system 1000 to various modes of transportation 1090. For example, system 1000 may be used in the control and/or entertainment systems of aircraft, trains, buses, cars for hire, private automobiles, waterborne vessels from private boats to cruise liners, scooters (for rent or owned), and so on. In various cases, system 1000 may be used to provide automated guidance (e.g., self-driving vehicles), general systems control, and otherwise. These any many other embodiments are possible and are contemplated. It is noted that the devices and applications illustrated in FIG. 10 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3)

both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to"

perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to" An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit device, comprising:
a semiconductor substrate;
two functional circuit regions positioned on the substrate with a power gated region positioned between the two functional circuit regions in a horizontal dimension of a substrate, wherein the power gated region includes:
a well region in the substrate oriented along a first direction in the horizontal dimension;
a first active region formed over the well region, the first active region being oriented along the first direction; and
a second active region formed over a portion of the substrate outside the well region, the second active region being parallel to the first active region along the first direction;
wherein the power gated region is apportioned into:
a first boundary cell positioned horizontally adjacent to a first one of the functional circuit regions, the first boundary cell including a first portion of the first active region over a first portion of the well region and a first portion of the second active region;
a second boundary cell positioned horizontally adjacent to a second one of the functional circuit regions, the second boundary cell including a second portion of the first active region over a second portion of the well region and a second portion of the second active region; and
a power switch cell positioned horizontally between the first boundary cell and the second boundary cell, the power switch cell including a third portion of the first active region over a third portion of the well region and a third portion of the second active region;
wherein the first, second, and third portions of the well region are continuous between the first boundary cell, the power switch cell, and the second boundary cell.

2. The device of claim 1, wherein the third portion of the first active region over the third portion of the well region is configured for power gating operation.

3. The device of claim 1, wherein the third portion of the second active region is electrically floating or electrically isolated.

4. The device of claim 1, wherein the first, second, and third portions of the first active region and the first, second, and third portions of the second active region are continuous between the first boundary cell, the power switch cell, and the second boundary cell.

5. The device of claim 1, wherein the first active region is a p-type active region, and wherein the second active region is an n-type active region.

6. The device of claim 1, wherein the well region is an n-well region and the substrate is a p-type substrate.

7. The device of claim 1, wherein the functional circuit regions are memory circuit regions.

8. The device of claim 7, wherein the power gated region is a memory channel region.

9. The device of claim 1, wherein the first, second, and third portions of the well region have constant widths between the first boundary cell, the power switch cell, and the second boundary cell.

10. The device of claim 1, wherein the power gated region further includes:
a second well region in the substrate oriented along the first direction;
a third active region formed over the second well region, the third active region being oriented along the first direction; and
a fourth active region formed over a portion of the substrate outside the well region and the second well region, the fourth active region being parallel to the first, second, and third active regions along the first direction.

11. The device of claim 10, wherein:

the first boundary cell includes a first portion of the third active region over a first portion of the second well region and a first portion of the fourth active region;

the second boundary cell includes a second portion of the third active region over a second portion of the second well region and a second portion of the fourth active region; and the power switch cell includes a third portion of the third active region over a third portion of the second well region and a third portion of the fourth active region;

wherein the first, second, and third portions of the second well region are continuous between the first boundary cell, the power switch cell, and the second boundary cell.

12. The device of claim 10, wherein the first active region and the third active region are positioned on opposing sides of the first boundary cell, the power switch cell, and the second boundary cell in a second direction orthogonal to the first direction.

13. A power switch apparatus, comprising:

a semiconductor substrate;

a well region formed in the substrate, the well region being oriented along a first direction in a horizontal dimension of the substrate;

a first boundary cell positioned on the substrate over at least a portion of the well region, the first boundary cell including a first active region formed over the well region and a second active region formed over a portion of the substrate outside the well region;

a second boundary cell positioned on the substrate over at least another portion of the well region, portions of the first active region and the second active region extending into the second boundary cell; and a power switch cell positioned between the first boundary cell and the second boundary cell, wherein the well region extends continuously through the power switch cell from the first boundary cell to the second boundary cell, and wherein a portion of the first active region in the power switch cell includes power gating logic.

14. The apparatus of claim 13, wherein the first active region and the second active region extend continuously through the power switch cell from the first boundary cell to the second boundary cell.

15. The apparatus of claim 13, wherein the first boundary cell is configured to be positioned horizontally adjacent a first functional circuit region positioned on the substrate.

16. The apparatus of claim 15, wherein the second boundary cell is configured to be positioned horizontally adjacent a second functional circuit region positioned on the substrate, the first functional circuit region and the second functional circuit region being separated by the power switch apparatus.

17. A power gating system for memory circuits, comprising:

a semiconductor substrate;

a first memory circuit region positioned on the substrate;

a second memory circuit region positioned on the substrate;

a well region formed in the substrate, the well region being oriented along a first direction in a horizontal dimension of the substrate and positioned between the first memory circuit region and the second memory circuit region in the first direction;

a first active region formed over the well region, the first active region being oriented along the first direction and positioned between the first memory circuit region and the second memory circuit region in the first direction;

a second active region formed over a portion of the substrate outside the well region, the second active region being parallel to the first active region along the first direction and positioned between the first memory circuit region and the second memory circuit region in the first direction;

a first boundary cell having a border adjacent to the first memory circuit region, the first boundary cell defining a first portion of the first active region over a first portion of the well region and a first portion of the second active region;

a second boundary cell having a border adjacent to the second memory circuit region, the second boundary cell defining a second portion of the first active region over a second portion of the well region and a second portion of the second active region; and a power switch cell having a first border adjacent the first boundary cell and a second border adjacent the second boundary cell, the power switch cell defining a third portion of the first active region over a third portion of the well region and a third portion of the second active region, and wherein the third portion of the first active region includes logic for power gating between the first memory circuit region and the second memory circuit region.

18. The system of claim 17, wherein at least one of the first memory circuit region and the second memory circuit region includes a plurality of memory circuits.

19. The system of claim 17, wherein the well region is continuous through the power switch cell from the first boundary cell to the second boundary cell.

20. The system of claim 17, wherein the third portion of the second active region is electrically floating or electrically isolated.

* * * * *